United States Patent [19]

Aytac et al.

[11] 4,397,887
[45] Aug. 9, 1983

[54] POSTPONED ROM PROGRAMMING

[75] Inventors: Haluk M. Aytac, Berkeley, Calif.; John F. MacDonald, Orem, Utah

[73] Assignee: National Semiconductor Corporation, Santa Clara, Calif.

[21] Appl. No.: 409,010

[22] Filed: Aug. 18, 1982

[51] Int. Cl.³ .................. B05D 5/12; H01L 7/44; B44C 1/22; C03C 15/00
[52] U.S. Cl. .................. 427/85; 29/571; 148/187; 156/653; 156/657; 156/659.1; 427/93
[58] Field of Search .......... 29/576 B, 571; 148/1.5, 148/187, 188, 190; 357/23, 41, 53; 427/85, 93; 156/653, 657, 659.1, 662

[56] References Cited

U.S. PATENT DOCUMENTS 4,135,289  1/1979  Brews et al. ............... 29/571
4,347,654  9/1982  Allen et al. ............... 156/628 X
4,354,309 10/1982  Gardiner et al. .......... 427/85 X Primary Examiner—William A. Powell
Attorney, Agent, or Firm—Neil B. Schulte; Paul J. Winters; Gail W. Woodward

[57] ABSTRACT

A process to program ROM's after the insulation, gates, and interconnect circuitry have been formed by using a contact mask to define openings at the depletion cells, which openings extend beside the gates to the sources and drain so as to allow phosphorus dopant to be diffused sideways under the gates to short out the cell.

4 Claims, 3 Drawing Figures

POSTPONED ROM PROGRAMMING

BACKGROUND OF THE INVENTION

In the prior art, semiconductor read-only memories, or ROM's, may be custom-built to include a number of cells that are conducting with the remainder of the cells non-conducting unless activated by a control gate. The latter cells comprise enhancement devices while the former comprise depletion devices. The particular selection of cells that are formed as depletion cells is unique to the information or program that is to be stored in the memory. The end user of the memory usually specifies which cells are to be depletion type cells and the ROM is then custom built to that specification.

Forming a depletion device requires certain steps early in the manufacturing process in the prior art. Hence the customer must wait for the entire manufacturing process to be completed after he specifies his desired program. If the device could be manufactured nearly to completion, and then programmed according to the customer's specifications, turn-around time from order to delivery would be considerably reduced. The present invention accomplishes this end.

SUMMARY OF THE INVENTION

The conventional way of creating a depletion device or cell in a ROM involves forming source and drain regions at the cell location with a channel extending therebetween. Early in the process the channel is doped to make it normally conducting. Thereafter, the various layers of insulating oxide, gates, and interconnections are formed above the channel. The present invention eliminates this channel doping step and instead simply continues the process with all cells configured as enhancement devices until near the end of manufacturer. At this time, the cells that are to be depletion devices are reopened and doping is achieved around the edges of the overlying gate so as to diffuse sideways under the gate and create a normally conducting channel. Hence the ROM is much closer to completion and delivery when the customer specifies the exact cells that are to be depletion devices.

Several other variations and advantages are explained in the detailed description that follows.

DESCRIPTION OF THE PREFERRED EMBODIMENT

Figure 1:
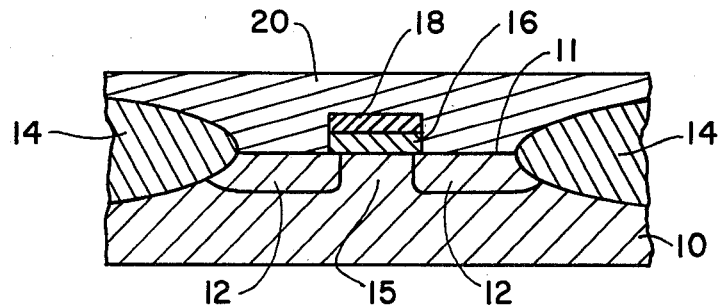
FIG. 1 is a fragmentary schematic section of a semiconductor ROM, taken at a depletion memory cell location as it would look well along in the production process.

The semiconductor device of FIG. 1 is manufactured using techniques well-known to those in the art so as to have a substrate 10, with a surface 11, upon which spaced apart source and drain areas 12 are formed. A field oxide 14 is grown everywhere on surface 11 that there are no devices. The channel 15 that extends between source and drain areas 12 is not yet doped but rather covered with a gate oxide 16 and an electrically conductive control gate 18. A protective oxide insulating layer 20 is formed over the top of the cells. Channel 15 is now conductive only when a voltage is applied to control gate 18 so that all the cells on the substrate are enhancement devices at this point.

Figure 2:
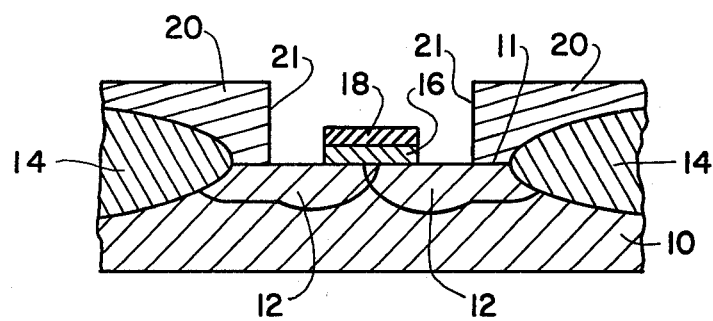
FIG. 2 shows how the cell of FIG. 1 is reopened for the depletion diffusion.

Information is stored in the memory by changing selected cells into normally conducting depletion devices in accordance with the customer's programming requirements. This is achieved, as shown in FIG. 2, by opening a hole above each cell that is to become a depletion device. It should be noted that no additional steps are required in the process because, at this stage of manufacture, a masking and etching step is required anyway to create openings in oxide layer 20 so as to make contact to the various gate lines or conductors just under the surface of the chip. So the mask used to define contacts is changed to also define openings 21 at all the depletion device locations as well.

Hole 21 is made enough wider than gate 18 that the oxide 20 may be etched down past the sides of gate 18 to the silicon substrate 10. A dopant may then be introduced by ion implantation, or some other method, to cause an increase in the size of source and drain areas 12. The dopant diffuses sideways under gate 18, as shown in FIG. 2, until areas 12 merge, and essentially short out the channel, creating a continuous conductive path through the cell. Phosphorus has a higher diffusion coefficient and is therefore a good choice as the dopant to be used at this step. Phosphorus more readily diffuses sideways to make the channel under gate 18 conductive.

Care must be exercised in the dimensioning of the cell, and in the amount of dopant added to areas 12, so that the areas 12 do not diffuse too far. If this were to happen, the source and drain areas might reach under field oxide areas 14 and short to adjacent memory cells. Clearly, the width of gate 18 must be such that the diffusion distance under it is less than the intercell diffusion distance. In experiments, continuous conductive paths under the gate have been successfully established without intercell shorts in devices having gate widths of about 3.5 microns.

Figure 3:
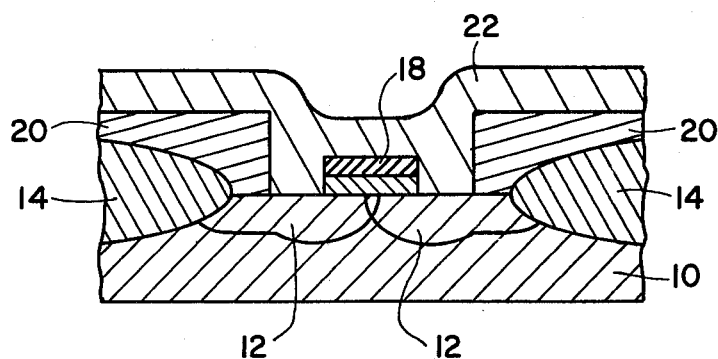
FIG. 3 shows an alternative diffusion technique.

FIG. 3 shows the finished cell with a protective layer of oxide 22 filling hole 21. FIG. 3 also may show an alternate embodiment of the invention. Typically, oxide layer 22 comprises a chemical vapor deposited oxide that includes about 8 percent phosphorus introduced as a getter material. If the source and drain areas 12 are N-type conductivity in a P-type substrate, as could be the case in this kind of product, the phosporus from layer 22 will diffuse into areas 12 and sideways under gate 18 so as to merge areas 12. In this case, the separate doping step through hole 21 may be eliminated.

In summary, then, the present invention eliminates the original masking and doping step needed to define the depletion devices and makes use of a later contact mask step to define depletion devices at a later time. So an expensive masking step is saved. Depletion doping may take place automatically from the dopant in the passivating oxide layer 22. And decisions on programming may be postponed until later in the process improving customer response time. Thus, a lower cost, more easily obtainable product results.

We claim:

1. In the fabrication of a silicon semiconductor field effect memory device wherein spaced apart source and drain areas are formed on a substrate with a channel extending therebetween and a control gate is formed above the channel with an oxide insulating layer covering the gate and device, an improvement to the process that allows the device to be converted into a normally conducting device late in the fabrication process comprising:

masking and etching the device so as to create openings to the source and drain areas on the substrate beside the control gate; and doping said source and drain areas through said openings so as to expand said areas toward each other, under said gate, until they form a continuous conduction path.

2. The process of claim 1 in which said source and drain areas are additionally doped by forming a doped oxide insulating layer on said device and in said opening.

3. The process of claim 2 in which said doped oxide comprises silicon oxide with about 8 percent phosphorus therein.

4. The process of claim 1 in which the source and drain areas are additionally doped with phosphorus through said openings and thereafter an insulating oxide layer is formed on said device and in said openings.

* * * * *

Notice of Adverse Decision in Interference

In Interference No. 101,247, involving Patent No. 4,397,887, H. M. Aytac and J. F. MacDonald, POSTPONED ROM PROGRAMMING, final judgment adverse to the patentees was rendered Feb. 7, 1986, as to claims 1, 2 & 4.

[*Official Gazette July 15, 1986.*]